United States Patent
Li

(10) Patent No.: US 7,898,088 B2
(45) Date of Patent: Mar. 1, 2011

(54) I/O PAD STRUCTURES FOR INTEGRATED CIRCUIT DEVICES

(75) Inventor: Felix C. Li, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 136 days.

(21) Appl. No.: 11/869,709

(22) Filed: Oct. 9, 2007

(65) Prior Publication Data

US 2009/0091016 A1   Apr. 9, 2009

(51) Int. Cl.
*H01L 23/48* (2006.01)
*H01L 23/52* (2006.01)
*H01L 29/40* (2006.01)

(52) U.S. Cl. .................. 257/776; 257/E23.015

(58) Field of Classification Search .......... 257/690, 257/698, E23.015, 776, E23.079; 438/462
See application file for complete search history.

(56) References Cited

U.S. PATENT DOCUMENTS

| | | | |
|---|---|---|---|
| 4,086,375 A * | 4/1978 | LaChapelle et al. | 438/461 |
| 5,311,405 A | 5/1994 | Tribbey et al. | |
| 5,384,488 A * | 1/1995 | Golshan et al. | 257/786 |
| 5,783,868 A * | 7/1998 | Galloway | 257/784 |
| 6,034,438 A | 3/2000 | Petersen | |
| 6,060,769 A | 5/2000 | Wark | |
| 6,420,208 B1 | 7/2002 | Pozder et al. | |
| 6,727,116 B2 | 4/2004 | Poo et al. | |
| 6,861,742 B2 * | 3/2005 | Miyamoto et al. | 257/693 |
| 6,894,386 B2 | 5/2005 | Poo et al. | |
| 2005/0194682 A1 | 9/2005 | Ohuchi et al. | |
| 2006/0186551 A1 | 8/2006 | Lange et al. | |

OTHER PUBLICATIONS

U.S. Office Action dated Apr. 21, 2008 for U.S. Appl. No. 11/869,708.
U.S. Final Office Action dated Aug. 15, 2008 for U.S. Appl. No. 11/869,708.
U.S. Appl. No. 11/774,473 filed on Jul. 6, 2007.
"Redistributed Process," http://www.flipchip.com/services/wafer_level/ultra_csp/redistributed_process.shtml, downloaded Dec. 13, 2007.
Notice of Allowance dated Oct. 3, 2008 from U.S. Appl. No. 11/869,708.

* cited by examiner

*Primary Examiner* — David A Zarneke
*Assistant Examiner* — Jenny L Wagner
(74) *Attorney, Agent, or Firm* — Beyer Law Group LLP

(57) ABSTRACT

A semiconductor device, including methods and arrangements for making the same, are described. The device includes an integrated circuit die having a plurality of bond pads. At least one bond pad on the active surface of the die is an extended I/O pad. Each extended I/O pad extends to at least one peripheral side edge of the die.

18 Claims, 5 Drawing Sheets

I/O PAD STRUCTURES FOR INTEGRATED CIRCUIT DEVICES

FIELD OF THE INVENTION

The present invention generally relates to integrated circuit (IC) devices. More particularly, the invention relates to the formation of input/output (I/O) pads suitable for use with IC devices.

BACKGROUND OF THE INVENTION

There are a number of conventional processes for packaging integrated circuit (IC) dice. In many applications it is desirable to form solder bumps directly on the active surface of an IC die. Typically, the solder bumps are formed on the active surface of the wafer before the individual dice are singulated from a wafer. When the resulting die is mounted onto a substrate or other appropriate carrier, the solder bumps may be reflowed to create electrical connections between the die and substrate. This style of electrically connecting IC dice is often called "flip-chip" mounting because the die is generally "flipped" in order to position the solder bumps on its active surface onto associated contacts on the surface of the substrate to which the die is to be attached. As the size constraints placed on IC dice and packages get smaller and smaller, there are an increasing number of applications in which flip-chip mounting is desirable.

The packaging of IC devices configured for use in power applications (e.g., IC devices designed to transport and/or regulate electrical power) often presents greater challenges than those encountered when packaging conventional IC dice not configured or intended for use in power applications. Generally, power packages include dice having lines that carry much higher currents (and sometimes higher voltages) than typical semiconductor devices. At the same time, many power devices also have signal lines that must be able to accommodate relatively high speeds. Those familiar with the art will appreciated that in most cases power IC devices and high speed IC devices are packaged separately. Due to a number of constraints, flip-chip mounting and packaging techniques have not been widely used for power applications. Accordingly, although existing packaging techniques work well, there are continuing efforts to develop even more efficient designs and methods for surface mounting IC components in order to accommodate a variety of different application requirements including the unique challenges of power applications.

SUMMARY OF THE INVENTION

In one aspect of the invention, a semiconductor wafer having dice with extended I/O pads is described. Each extended I/O pad is arranged to extend to at least one peripheral side edge of its associated die (e.g. to at least one associated singulation street). The number of extended I/O pads on a die may vary from a single I/O pad to all of the I/O pads in accordance with the needs of a particular design. In this way, when the wafer is singulated along the singulation streets to separate the integrated circuit dice, each individual singulated die will include at least one extended I/O pad that extends to at least one peripheral side edge of the individual singulated die.

In various embodiments, the extended I/O pads are formed by depositing one or more metallic layers over one or more associated bond pads. In some embodiments, one or more of the extended I/O pads on each die may be arranged to extend to two (or more) peripheral side edges of their associated die. Additionally, some of the extended I/O pads may be arranged to transmit a current of at least 10 Amperes.

In another embodiment, a semiconductor device is described. According to various embodiments, the device includes an integrated circuit die such as that formed by singulating the aforementioned wafer such that the die includes at least one extended I/O pad that extends to at least one peripheral side edge of the individual singulated die.

In another embodiment, a method of manufacturing an integrated circuit die from a semiconductor wafer is described. The method includes depositing one or more metallic layers over bond pads on each die of the wafer, each of these bond pads being positioned apart from the peripheral side edges of the die. The one or more deposited metallic layers form at least one extended I/O pad that is electrically connected to at least one of the one or more bond pads positioned apart from the peripheral side edges of the die. Each extended I/O pad is arranged such that it extends to at least one peripheral side edge of its associated die (e.g. to at least one associated singulation street). The method further includes singulating the wafer to separate the integrated circuit dice. The singulating proceeds along the singulation streets such that each extended I/O pad on each individual singulated die extends to at least one peripheral side edge of the individual singulated die.

In some embodiments, the metallic layers are deposited such that the extended I/O pads overlap portions of the singulation streets to guarantee that each extended I/O pad will extend to a peripheral edge of its associated die after singulation.

These and other features, aspects, and advantages of the invention will be described in more detail below in the detailed description and in conjunction with the following figures.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE DRAWINGS

Figure 1:
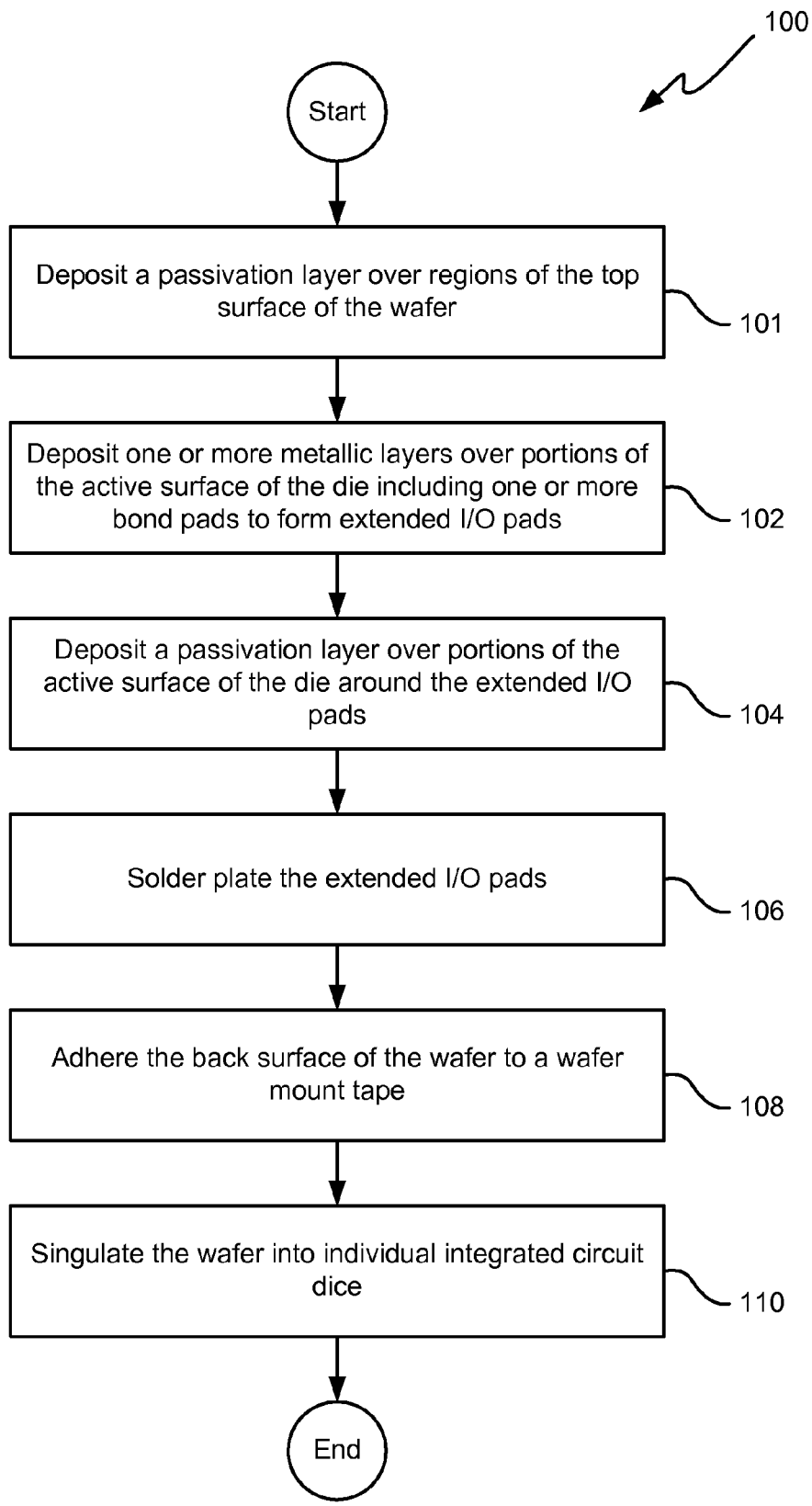
FIG. 1 is a flow chart illustrating a process for producing integrated circuit dice in accordance with an embodiment of the present invention.

The present invention generally relates to integrated circuit (IC) devices. More particularly, the invention relates to the formation of input/output (I/O) pads suitable for use with IC devices. According to various embodiments, IC dice are described that each have at least one extended I/O pad that extends to at least one peripheral side edge of the top surface of the associated die.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessary obscuring of the present invention.

There are continuing efforts to reduce die and package sizes in many integrated circuit power package applications. These constraints pose particularly difficult challenges in power packages which must provide adequate heat dissipation from ever-decreasing packages sizes while handling high power levels. These constraints and challenges are especially relevant for mobile power applications requiring both portability and miniature size. For many power applications it is desirable to limit both the footprint of the package as well as the thickness of the package. By way of example, packages having lengths and widths of less than 1 mm and thickness less than 0.4 mm are increasingly desired. In modern power applications, currents exceeding, by way of example, 10, 12, or 15 Amperes (A) and even greater may be required. To make matters worse, the available real estate for I/O pads on the active surface of the die is increasingly limited as a result of the size constraints placed on the die. Furthermore, with increased power comes increased heat generation, a problem that is generally amplified as devices are made ever smaller.

In solder-bumped devices, such as those utilizing flip-chip (FC) technology, each I/O pad and associated solder bump can typically carry only, by way of example, approximately 1.5 Amperes (A) of current without overheating and causing damage to the solder bumps, integrated circuits and/or package. Typical packages utilizing FC technology include conventional FC packages suitable for use in chip-on-board (COB) applications, in which the FC die is inverted and connected to contact pads on a substrate such as a printed circuit board (PCB) via solder bumps on the active surface of the die, and flip-chip-on-lead (FCOL) packages in which the die is connected to metallic leads via solder bumps on the active surface of the die and where the leads are then connected to contact pads on a PCB.

The amount of current carried by each solder bump is limited in part by the size of the solder bump (e.g., the diameter of the solder bump), or more particularly, the dimensions of the reflowed solder joint connection made by reflowing the solder bump. The diameter of the solder bump is, in turn, limited by the size of the corresponding I/O pad, which is in turn limited by the available real estate on the active surface of the die. More particularly, for a given die footprint, the layout (distribution), size and shape of the I/O pads is limited by the regions on the active surface of the die available for bonding and the total area of the active surface of the die as well as proximity constraints placed on the I/O pads. More specifically, the solder bumps must not be positioned too close to one another so as to avoid solder bridging between adjacent solder bumps. That is, the minimum distance between adjacent bumps on the active surface of the die can only be reduced to a limited extent without significantly increasing the risk of solder bridging between adjacent solder bumps. Solder bridging may result in electrical shorting, package failure or may otherwise interfere with the performance of the integrated circuit die.

Additionally, the size of the solder bumps used in connecting I/O pads on the die to substrate contact pads connected to power or ground lines (carrying high currents) is generally limited to the maximum size of the solder bumps used in connecting other I/O pads to contact pads used for transmitting signal lines, which must generally accommodate higher speeds. More specifically, not only do larger solder bumps, such as those required by power I/O pads, occupy more real estate, they also may be inappropriate to transmit high speed signals due to their associated higher resistances and time delays. However, the use of solder bumps having different sizes, and particularly heights, is generally not feasible due to complications and risks when connecting the I/O pads on the die to a substrate.

In many conventional wire-bonded packages, multiple wires are generally bonded to each I/O pad on the die designated for connection to power or ground lines. By way of example, three or more bonding wires are often used. However, one disadvantage in using bonding wires is that there is significantly less heat dissipation possible through the bonding wires, which are typically less than 75 microns (µm) in diameter, than through solder bumps. Additionally, packages utilizing bonding wires have inherently larger footprints and often thicknesses than their corresponding solder-bumped counterparts as a result of having to wire bond around the periphery of the associated die.

As will be appreciated by those familiar with the art, the I/O pads used with solder-bumped and wire-bonded dice may be the original bond pads on the original active surface of the die, but are more often bond pads that have been redistributed from the original bond pads using conventional redistribution techniques. More particularly, the original bond pads are often distributed around the perimeter of the die at a prescribed distance from the peripheral edges of the die. This bond pad configuration is generally suitable for most wire-bonded applications; however, it is often advantageous to redistribute the original bond pads using metal redistribution lines to form a desired final I/O bond pad array layout (hereinafter a "final I/O bond pad" will also be referred to as an "I/O pad").

One class of IC devices are referred to as surface mount devices (SMDs). SMDs are IC dice or IC die packages that are intended to be mounted directly to surface contacts (contact pads) on the surface of a PCB. SMDs include both solder-bumped (such as those produced with FC technology) as well as wire-bonded die packages. One particular relatively new subclass of SMDs are known as micro SMDs (also "µSMDs"). Micro SMDs are chip scale packages (CSPs) in which the footprint of the package is substantially the same as the footprint of the associated die. A CSP is a package in which no pins or wires are used. Generally, a CSP must have a footprint no greater than 1.2 times that of the footprint of the associated packaged die. Typical micro SMDs have a footprint that is less than 2 mm by 2 mm square and some micro SMDs have lengths and widths less than 1 mm. In typical configurations, by way of example, micro SMDs have 4, 5 or 8 I/O pads formed on the active surface of the die that have been redistributed from the original bond pads. Micro SMDs offer small footprints, high I/O densities, better electrical and thermal performance than comparable wire-bonded packages and high moisture sensitivity level (MSL) performance, among other advantages. As such, micro SMDs are particularly desired in mobile power applications Particular embodiments of the present invention will now be described with reference to FIGS. 1-5. The following description focuses on the preparation of IC dice for use in power applications. In one embodiment, a process is described for producing IC dice that each have at least one extended I/O pad formed over the active surface of the die. Each extended I/O pad is arranged such that it is exposed on the active (top) surface of the die and extends to at least one peripheral side edge of the active surface of the die. To facilitate the following discussion, the topmost surface of the die will generally be referred to as the active surface; that is, the top surface of any layer deposited over the active surface of the die will then be referred to as the active surface of the die. According to the embodiments described herein, the extended I/O pads are formed over the active surfaces of dice at the wafer level before the wafer is singulated to produce individual IC dice.

Various embodiments of the present invention are suitable for use in producing SMDs, and particularly, micro SMDs. Various embodiments of the present invention are also generally suitable for use in producing other CSPs and wafer level packages (WLPs) and particularly packages suitable for use in COB applications.

Figure 2A:
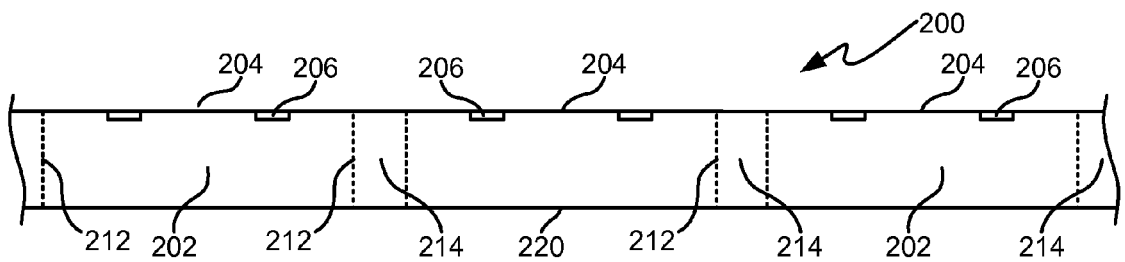
FIGS. 2A-2F illustrate diagrammatic cross-sectional side views of a wafer in accordance with various embodiments of the present invention.

Referring initially to FIG. 1, and further in view of FIGS. 2-3, a process 100 of preparing IC dice in accordance with particular embodiments will be described. Initially, a semiconductor wafer that includes a large number of IC dice is fabricated. As is well known in the art, most wafers are formed of silicon (Si), although any other appropriate semiconductor material can also be used. FIG. 2A illustrates a diagrammatic cross-sectional view of a portion of a suitable wafer 200. While the wafer diagrammatically illustrated by FIG. 2A shows only a few IC dice 202, it will be appreciated by those familiar with the art that state of the art wafers will typically have several hundred to several thousand dice formed therein and it is expected that even higher device densities will be attained in future wafers. Each die 202 will become an IC component after it is singulated from the wafer 200.

As will be appreciated by those familiar with the art, an IC die 202 generally has multiple metallization layers that overlie active circuits formed in the semiconductor substrate of the die. The number of metallization layers used in a particular die may vary significantly based on the needs of a particular device. Intermediate dielectric layers are typically interposed between the metallization layers to physically and electrically separate the metallization layers. Electrically conductive vias are formed in the dielectric layers at appropriate locations in order to electrically connect specific portions of the metallization layers in desired locations. The various metallization layers may be used as ground/power planes and/or as signal routing interconnects within the IC die. A variety of materials may be used to form the dielectric and metallization layers. By way of example, aluminum and copper are often used materials for the metallization layers and (in Si based devices) silicon dioxide, silicon nitride or other oxides and/or nitrides are commonly used to form the dielectric layers. Selected portions of the topmost metallization layer are left exposed through various openings in the outermost dielectric or passivation layer on the active surface 204 of each die 202 to form a plurality of bond pads 206 that serve as electrical contacts for the die. The bond pads 206 themselves may serve as I/O pads that can then be electrically connected to an external device, such as a PCB, using conventional techniques.

However, according to embodiments of the present invention, bond pads 206 on the active surface 204 of each die are redistributed to form one or more extended I/O pads 208. In the illustrated embodiment, a passivation layer is deposited (or grown) at 101 over regions 205 of the top surface of the wafer 200 corresponding to the active surfaces 204 of the dice 202 including the associated singulation streets (i.e., saw streets or scribe streets) 214 separating adjacent dice 202. The passivation layer formed at the regions 205 may be formed from any suitable material including those used to form the dielectric layers described above.

Figure 2B:
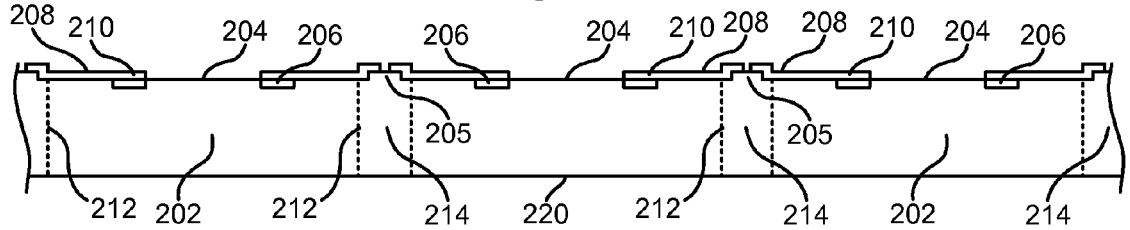
Figure 3:
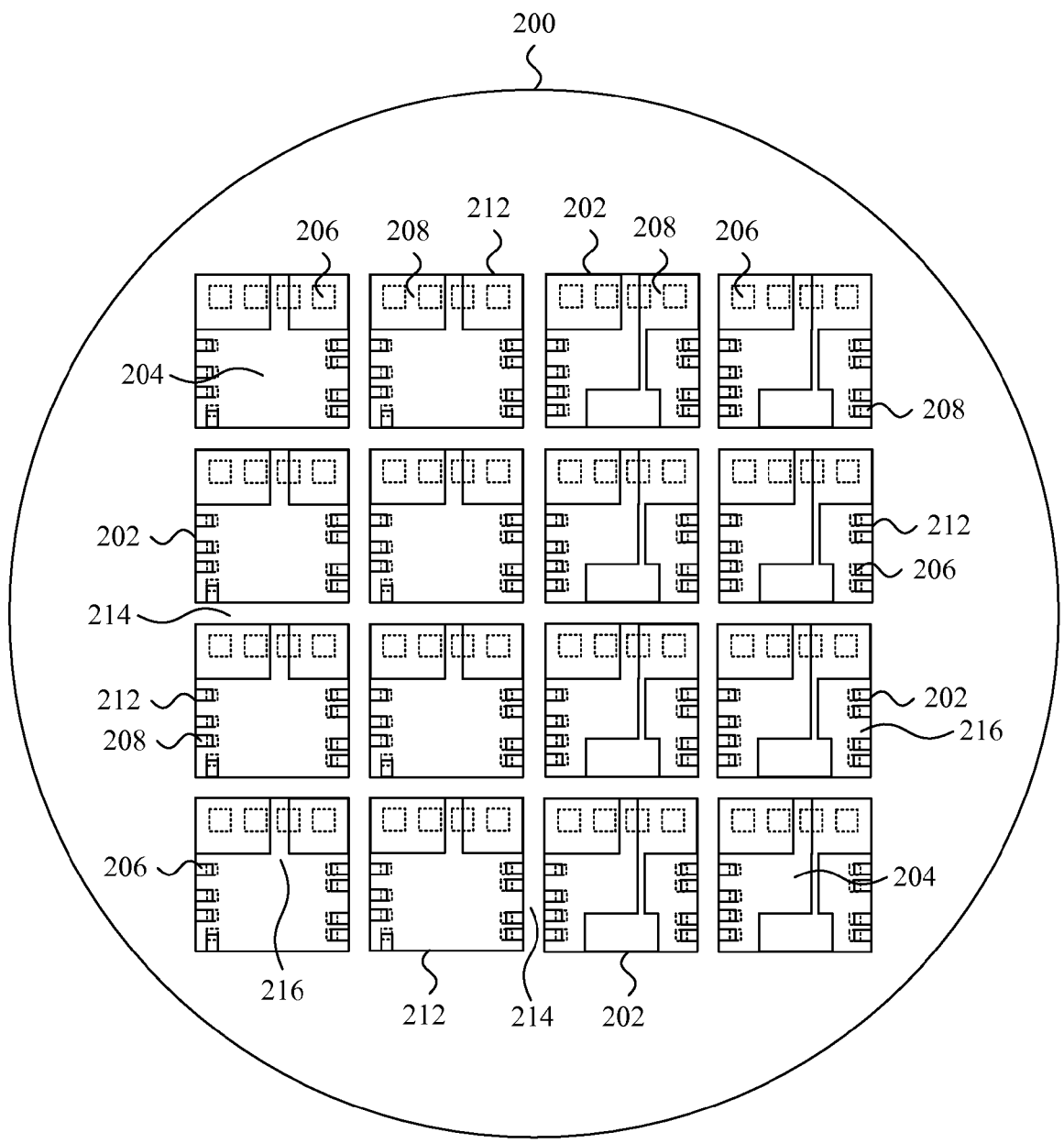
FIG. 3 illustrates a diagrammatic top view of a wafer in accordance with an embodiment of the present invention.

The bond pads 206 are redistributed by depositing, at 102, one or more conductive metallic layers 210 over the active surface 204 of each die, as illustrated in FIGS. 2B and 3. The metallic layer(s) 210 are deposited over at least a portion of the bond pads 206, to form the extended I/O pads 208. In the illustrated embodiment, each of the extended I/O pads 208 extends at least to at least one peripheral side edge 212 of the associated die 202. The layout and geometry of the extended I/O pads 208 may be widely varied based on the requirements of a particular application. FIG. 3 illustrates a diagrammatic top view of wafer 200 that includes two example embodiments of extended I/O pad layouts and geometries. The original bond pads 206 are drawn with dotted lines while the extended I/O pads 208 are drawn with solid lines. As illustrated in FIG. 3, some of the extended I/O pads 208 may be arranged to extend to two or more peripheral side edges 212 of each die 202. In another embodiment, not all of the extended I/O pads 208 extend to the peripheral side edges 212 of the dice. In the embodiment illustrated by the two rightmost columns of dice, each die 202 includes an extended I/O pad 208 that extends to two opposite peripheral edges 212 of the die. In general, the larger the exposed surface area of the I/O pad, the more heat dissipation that is possible out of the die and the more reliable the solder joint will be.

The metallic layer(s) 210 may be deposited with any suitable manner and may be formed from any suitable conductive material. By way of example, the metallic layer(s) 210 may be formed using conventional redistribution materials and/or materials generally associated with under bump metallizations (UBMs). As will be appreciated by those familiar with the art, UBMs are often formed over bond pads to provide a better bonding surface for the associated solder bumps. Generally, UBMs are comprised of multiple overlapping metallic layers having the combined features of adhesion, diffusion barrier, wetting and oxidation protection. Similarly, the metallic layer(s) 210 may constitute multiple layers of different materials. By way of example, one or more of tungsten, copper, nickel vanadium, aluminum and titanium, may be used in forming the metallic layer(s) 210, among others. The metallic layer(s) 210 may be deposited using a number of processes known in the art such as, by way of example, evaporation, electroplating and sputtering.

In the illustrated embodiment, the metallic layer(s) 210 are deposited such that the metallic layer(s) extend beyond the associated peripheral side edges 212 of the dice such that the metallic layer(s) overlap associated singulation streets 214 separating adjacent dice 202. In various embodiments, given singulation tolerances, it is desirable for the metallic layer(s) 210 to overlap at least a portion of associated singulation streets 214 to ensure that the associated extended I/O pads do indeed extend to the peripheral side edges 212 of the associated dice 202 after singulating the wafer 200. In various embodiments, the metallic layer(s) 210 of adjacent dice 202 are deposited such that they are integrally formed with one another and completely overlap their associated singulation streets 214.

Figure 2C:
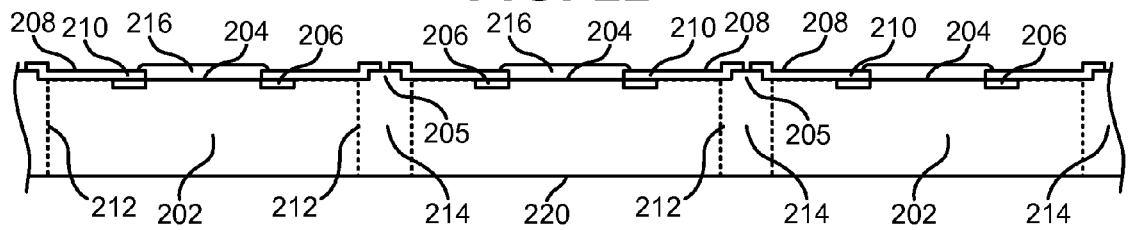

After the deposition of the metallic layer(s) 210, a protective layer 216 is deposited (or grown) at 104 over the active surface of the wafer 200 while leaving portions of the metallic layer(s) 210 exposed on the active surfaces 204 of the dice 202 to form the extended I/O pads 208, as illustrated in FIG. 2C. Although any suitable material may be used to form the protective layer 216, in one embodiment, the protective layer 216 is formed of benzocyclobutene (BCB). The protective layer 216 may be deposited in any suitable manner. By way of example, in one embodiment, a protective layer 216 of BCB is deposited using a spin coating process.

The final exposed I/O pads 208 may assume a variety of sizes, shapes and layouts on the active surfaces 204 of the dice. In the illustrated embodiment, each extended I/O pad 208 has a substantially rectangular shape. However, it should be appreciated that in alternative embodiments, the geometry of the various I/O pads may be widely varied. For example, in some embodiments, one or more corners of each extended I/O pad 208 may be rounded. In other embodiments, circular, oval or other geometries may be used for the I/O pads.

The extended I/O pads 208 that are intended for connection to power lines carrying at least 1 A (hereinafter also referred to as extended power I/O pads 208a) preferably have footprints much larger than other extended I/O pads 208 intended for connection to signal lines (hereinafter also referred to as extended signal I/O pads 208b). The described extended power I/O pad 208a structure is well suited for use in applications that require the reliable carrying of currents exceeding 10, 12, 15 or more Amperes. Additionally, in some applications, it may be desirable to redistribute two or more bond pads 206 to form a single extended power I/O pad 208a so that the extended I/O pad can reliably carry more current than could be carried through a single bond pad. Each resultant extended signal I/O pad 208b is sized and otherwise configured to be suitable for transmitting signals.

Figure 2D:
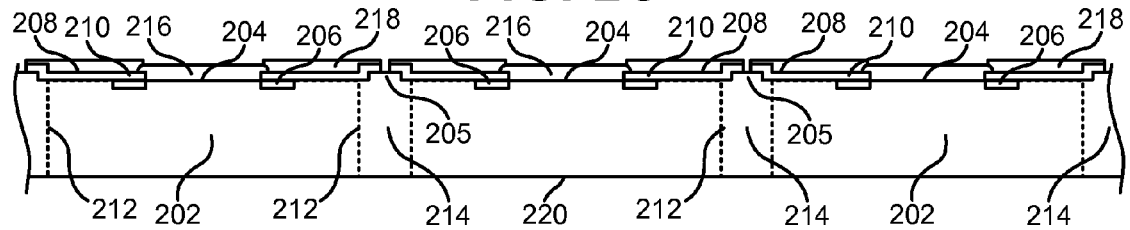

According to particular embodiments, the extended I/O pads 208 are solder plated at 106 at the wafer level prior to singulating the wafer 200 into individual IC dice 202. In a preferred embodiment, every exposed region of each of the extended I/O pads 208 is covered with a solder layer 218, as illustrated in FIG. 2D. As such, peripheral portions of the solder layers 218 may extend over the singulation streets 214. There are many different methods suitable for solder plating the extended I/O pads 208 to form the solder layers 218. By way of example, stencil or screen printing, electroplating and evaporation are some of the widely employed soldering technologies that may be used to form solder layers 218 on the extended I/O pads 208, although other soldering technologies may also be used.

In some embodiments, particularly those in which stencil or screen printing are employed to apply solder paste to the I/O pads 208, the solder paste is reflowed after application but prior to singulating the wafer 200. In these embodiments, solder flux is applied to the extended I/O pads 208 prior to applying the solder paste to ensure that the solder spreads across each entire I/O pad 208 during reflow of the solder to form the solder layer 218. In other embodiments, such as those in which electroplating or evaporation are used, flux is generally not applied to the I/O pads 208 prior to solder plating and the solder layers 218 are not reflowed prior to singulating the wafer 200. In various embodiments, the resulting solder layers 218 are relatively flatter (i.e., more uniform in height) than conventional solder bumps which, in contrast, are generally hemispherical or spherical in shape. Although the extended I/O pads 208 could be solder plated after singulation, this is generally regarded as impractical; however, solder plating after singulation would eliminate having to saw through (or otherwise singulate) any solder material overlapping the singulation streets 214.

Generally, in many modern applications it is desirable to thin the wafer 200. By way of example, it may be desirable to thin the wafer 200, and hence the associated dice 202, so as to keep within package thickness constraints or to increase heat dissipation out of the dice. As such, the back surface 220 of the wafer may be subjected to a backgrinding operation. Backgrinding allows the wafer 200 and associated dice 202 to be brought into conformance with a desired thickness and may be accomplished by any of a number of methods known in the art.

Figure 2E:
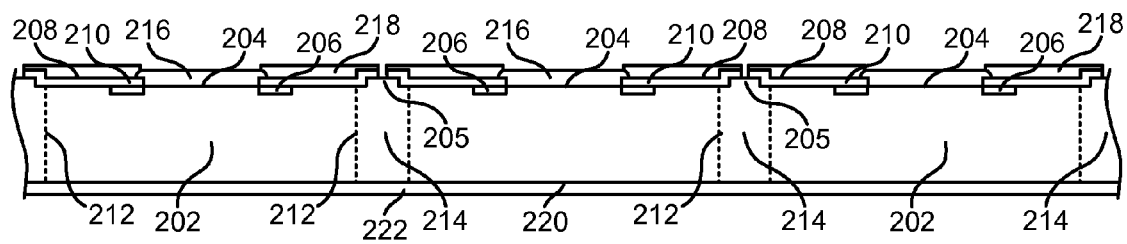
Figure 2F:
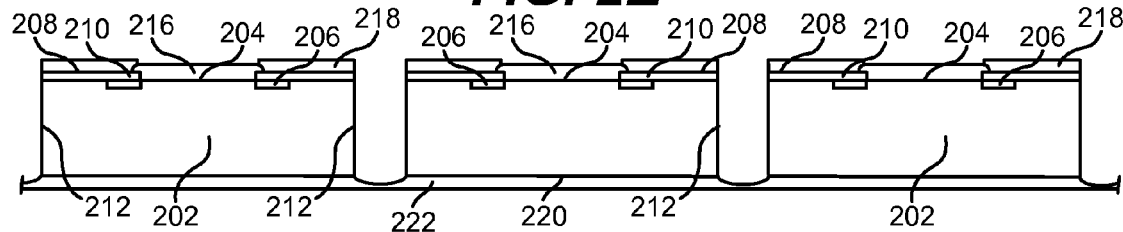

At 108, the back surface 220 of the wafer is adhered to a wafer mount tape 222 prior to singulation, as illustrated in FIG. 2E. The wafer 200 is singulated at 110 to produce individual IC dice 202. Singulation may be accomplished through any of a number of suitable methods including, sawing, gang cutting (sawing) or laser cutting. The singulation proceeds along the singulation streets 214 thereby separating adjacent dice and ensuring that the extended I/O pads 208 extend to the peripheral side edges 212 of associated dice 202. FIG. 2F illustrates singulated dice 202 adhered to the wafer mount tape 222.

The individual die 202 may then be removed from the wafer mount tape 222 and, in various embodiments, tested and subsequently taped and reeled, positioned in a suitable waffle or gel pack, or otherwise arranged for handling or shipment. After singulation and removal from the tape 222, each individual die 202 is suitable for mounting onto a PCB or other substrate.

Figure 4:
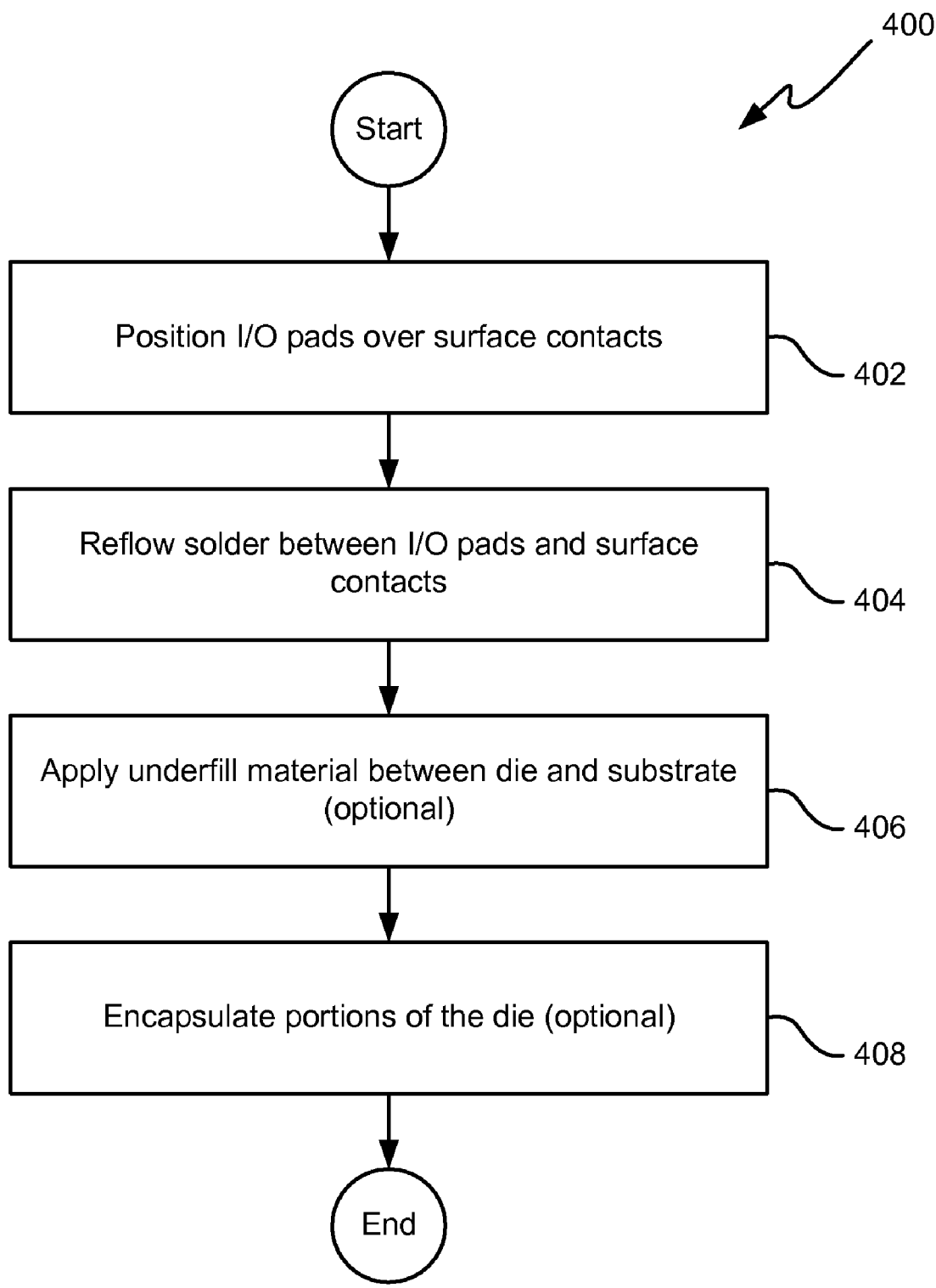
FIG. 4 is a flow chart illustrating a process for mounting an integrated circuit die to a printed circuit board in accordance with an embodiment of the present invention.
Figure 5A:
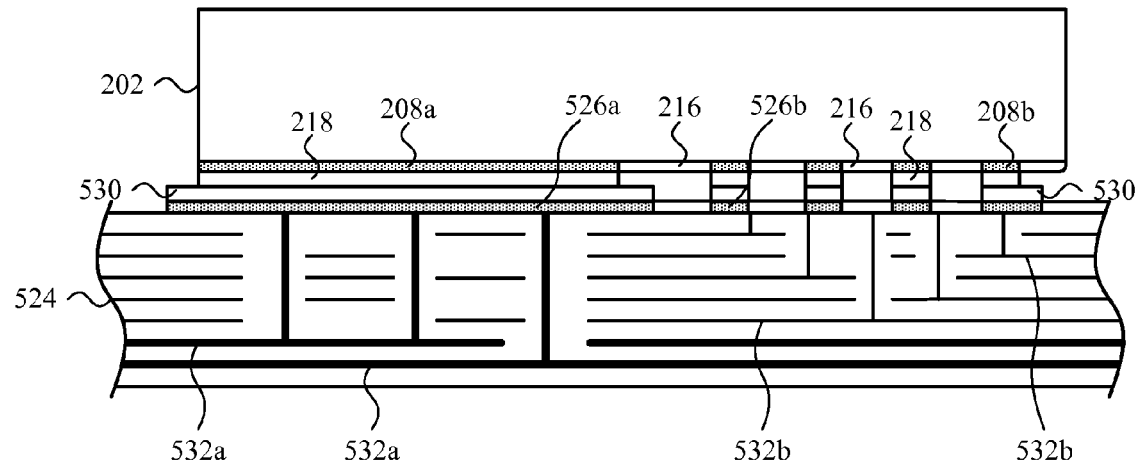
FIGS. 5A-5B illustrate diagrammatic cross-sectional side views of an integrated circuit die and printed circuit board in accordance with various embodiments of the present invention.

With reference to FIGS. 4 and 5, a process 400 is described for mounting the dice 202 to PCBs or other suitable carrier substrates. In one particular embodiment, a die 202 is inverted and flip-chip mounted to a PCB 524. At 402, the extended I/O pads 208 on the active surface 204 of the die are positioned onto corresponding surface contacts (contact pads) 526 on the surface 528 of the PCB 524, as illustrated in FIG. 5A. The surface contacts 526 are generally sized and arranged to correspond with associated extended I/O pads 208 on the die 202. In preferred embodiments, some or all of the surface contacts 526 extend peripherally beyond the associated extended I/O pads 208. The surface contacts 526 may be solder plated with solder layers 530 to facilitate physical and electrical connection to associated extended I/O pads 208. In other embodiments, solder flux may be applied to all or portions of the surface contacts 526.

The PCB 524 may have various power, ground and/or signal lines. The larger extended power I/O pads 208a are positioned over surface contacts 526a connected to the power or ground lines 532a so that after reflow, solder joint connections 534a are formed that can carry higher current, such as, by way of example, current greater than or equal to 1 A, and in some instances, currents greater than 10 A. The smaller extended signal I/O pads 208b are positioned over surface contacts 526b connected to signal lines 532b so that after reflow, solder joint connections 534b are formed that are suitable for the signal lines.

Figure 5B:
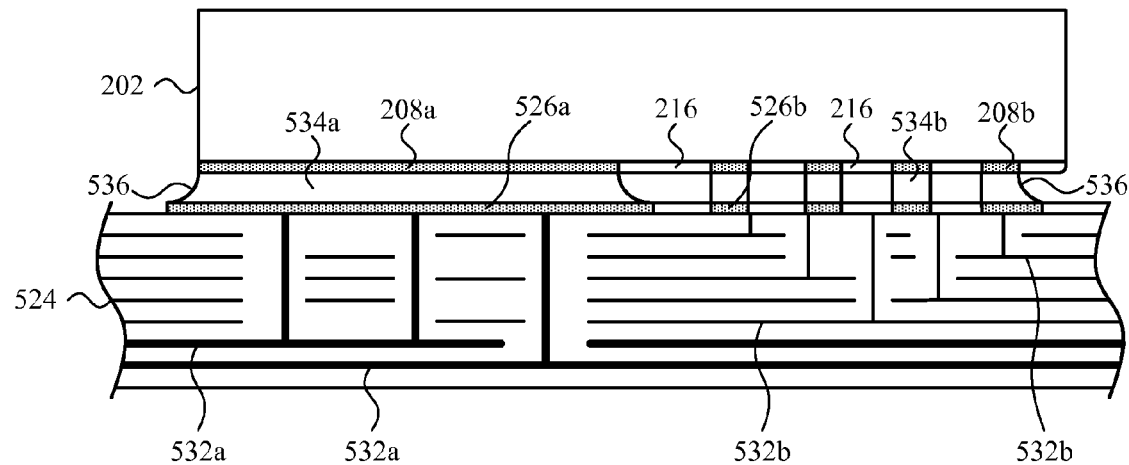

At 404 the die 202 and PCB 524 are placed in a reflow oven to reflow the solder layers 218 and 530. Reflowing the solder completes the solder joint connections 532 and 534 between the extended I/O pads 208 and the surface contacts 526, as illustrated in FIG. 5B. Since the solder layers 218 covering both the extended power and signal I/O pads 208 have substantially the same height, upon reflow of the solder, the resultant solder joint connections 534 have substantially the same height despite having significantly different footprints.

In the embodiment illustrated in FIG. 5B, solder fillets 536 are formed around the periphery of each solder joint connection 534. In the illustrated embodiment, the solder fillets 536 are formed between the outer peripheral edges of the extended I/O pads 208 and the associated surface contacts 526 and extend beyond the peripheral side edges 212 of the die 202. The formation of these solder fillets 536 is made possible as a result of the extended I/O pads 208 extending to the peripheral side edges 212 of the die and the surface contacts 526 extending beyond the peripheral side edges 212 of the die 202. In various embodiments, it may or may not be desirable to form solder fillets 536 between inner edges (as opposed to the outer peripheral edges around the periphery of the die 202) of the extended I/O pads 208 and surface contacts 526. The solder fillets 536 strengthen the resultant physical bond between the solder joint connections 534 and the PCB 524. The fillets 536 also increase the surface area of the solder joint connections 534 in contact with the PCB 524 thereby increasing the heat dissipation out of the die 202.

To aid in alleviating stresses in and around the solder joint connections 534, in some embodiments, as described above, the extended I/O pads 208 have slightly rounded corners. In particular, in the case of an extended I/O pad 208 that is positioned at a corner of the die 202, it may be desirable in one embodiment that the corner of the extend I/O pad that corresponds to the corner of the die be rounded. In this way, the interface between the associated adjacent solder fillets 536 on either side of the corner is smoother and less abrupt.

At 406, an underfill material is optionally applied in some embodiments into the space between the PCB 524 and the active surface 204 of the die not occupied by the solder joint connections 534. Generally, the underfill material may provide additional electrical insulation between the die 202 and the PCB 524 and serve as a stress reducing medium.

Additionally, in one embodiment, portions of the die 202 may be encapsulated at 408 with an encapsulant compound. By way of example, a glob-top technique may be used to apply an epoxy resin or conformal coating to at least the solder joint connections 534 and surface contacts 526. In one embodiment, most of the back surface of the die, if not the entire back surface, remains exposed and unencapsulated by the encapsulant compound. In other embodiments, the die 202, solder joint connections 534 and surface contacts 526 are not encapsulated at all.

Although, embodiments of the present invention have been described with reference to flip-chip mounting a die to a PCB, it will be apparent to those having skill in the art that particular embodiments described above may be practiced in applications in which a die is mounted to other substrates such as, by way of example, lead frames or those used in a ball-grid array (BGA) packages as well.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A semiconductor wafer, comprising:
a multiplicity of integrated circuit dice arranged therein, each die having an active surface and a back surface, each back surface being substantially opposite the active surface, the back surfaces of the dice cooperating to form the back surface of the wafer;
a plurality of singulation streets that define the two-dimensional array of dice, the singulation streets separating associated peripheral side edges of adjacent dice from one another;
a multiplicity of bond pads, the bond pads being arranged such that each die includes a plurality of bond pads on its active surface, the plurality of bond pads of each die including at least a set of signal bond pads configured for carrying electrical signals and a set of power bond pads configured for coupling to power or ground lines; and
one or more metallic layers deposited substantially uniformly over portions of the active surface of each die and arranged to overlie at least two of the power bond pads from each die to form at least one extended I/O pad on the active surface of the die that is electrically connected with each of the associated at least two power bond pads, each extended I/O pad extending at least to and coming in direct contact with at least one peripheral side edge of the associated die, the extended I/O pad including a contact surface that overlies one of the power bond pads and extends to the at least one peripheral side edge of the associated die, wherein each of the extended I/O pads on the active surface of the die forms an external contact pad arranged to electrically connect with an external device positioned over the active surface of the die.

2. A semiconductor wafer as recited in claim 1, wherein each extended I/O pad is configured to transmit a current of at least approximately 10 Amperes.

3. A semiconductor wafer as recited in claim 1, wherein each extended I/O pad is comprised of one or more metallic layers deposited over one or more associated bond pads that are positioned apart from peripheral side edges of the die such that each extended I/O pad is electrically coupled to at least one associated bond pad that is positioned apart from the peripheral side edges of the die.

4. A semiconductor wafer as recited in claim 3, wherein the plurality of bond pads of each die includes at least one extended I/O pad on the active surface of each die that has a footprint that is substantially larger than a combined footprint of the one or more associated bond pads coupled to the extended I/O pad.

5. A semiconductor wafer as recited in claim 1, wherein each extended I/O pad further includes a layer of solder deposited onto exposed portions of the extended I/O pad such that the layer of solder deposited substantially covers the exposed portions of the extended I/O pad.

6. A semiconductor wafer as recited in claim 1, wherein all of the bond pads on the active surface of each die are extended I/O pads.

7. The semiconductor wafer as recited in claim 1, wherein an extended I/O pad on one of the dice extends into and overlaps at least one of the singulation streets.

8. The semiconductor wafer as recited in claim 1, wherein the contact surface of each extended I/O pad includes a rectangular surface that directly overlies at least one of the bond pads on the associated die and at least one of the peripheral side edges of the associated die.

9. The semiconductor wafer as recited in claim 1, wherein the contact surface of each extended I/O pad is covered with a layer of solder, the layer of solder overlying at least one of the bond pads of the associated die and at least one of the peripheral side edges of the associated die.

10. The semiconductor wafer as recited in claim 1, wherein each extended I/O pad includes an outer surface, the contact surface being a portion of the outer surface, the semiconductor wafer further comprising a protective layer that partially covers the outer surface of the extended I/O pad while leaving the contact surface exposed.

11. The semiconductor wafer as recited in claim 1, wherein substantially the entire contact surface of each extended I/O pad is suitable for being covered with solder to help electrically couple the contact surface with the external device.

12. The semiconductor wafer as recited in claim 1, wherein an extended I/O pad on one of the dice extends to and comes in direct contact with at least two opposing peripheral side edges of the one of the dice.

13. A semiconductor device, comprising:
- an integrated circuit die having an active surface and a back surface, the back surface being substantially opposite the active surface;
- a plurality of bond pads arranged on the active surface of the die, the plurality of bond pads including at least a set of signal bond pads configured for carrying electrical signals and a set of power bond pads configured for coupling to power or ground lines; and
- one or more metallic layers deposited substantially uniformly over portions of the active surface of the die and arranged to overlie at least two of the power bond pads to form at least one extended I/O pad on the active surface of the die that is electrically connected with each of the associated at least two power bond pads, each extended I/O pad extending to and coming in direct contact with at least one peripheral side edge of the die, the extended I/O pad including a contact surface that overlies one of the power bond pads and extends to the at least one peripheral side edge of the associated die, wherein each of the extended I/O pads on the active surface of the die forms an external contact pad arranged to electrically connect with an external device positioned over the active surface of the die.

14. A semiconductor device as recited in claim 13, wherein each extended I/O pad is configured to transmit a current of at least approximately 10 Amperes.

15. A semiconductor device as recited in claim 13, wherein at least one extended I/O pad on the active surface of the die extends at least to at least two different peripheral side edges of the die.

16. A semiconductor device as recited in claim 13, wherein each extended I/O pad is comprised of one or more metallic layers deposited over one or more associated bond pads that are positioned apart from peripheral side edges of the die such that each extended I/O pad is electrically coupled to at least one associated bond pad that is positioned apart from the peripheral side edges of the die.

17. A semiconductor device as recited in claim 13, wherein each bond pad includes a layer of solder deposited onto the bond pad such that the solder substantially covers each bond pad, whereby the solder deposited onto each extended I/O pad substantially extends to the peripheral side edge of the die.

18. A semiconductor wafer, comprising:
- a multiplicity of integrated circuit dice arranged therein, each die having an active surface and a back surface, each back surface being substantially opposite the active surface, the back surfaces of the dice cooperating to form the back surface of the wafer;
- a plurality of singulation streets that define the two-dimensional array of dice, the singulation streets separating associated peripheral side edges of adjacent dice from one another;
- a multiplicity of bond pads, the bond pads being arranged such that each die includes a plurality of bond pads on its active surface, the plurality of bond pads of each die including at least a set of signal bond pads configured for carrying electrical signals and a set of power bond pads configured for coupling to power or ground lines; and
- one or more metallic layers deposited substantially uniformly over portions of the active surface of each die and arranged to overlie at least two of the power bond pads from each die to form at least one extended I/O pad on the active surface of the die that is electrically connected with each of the associated at least two power bond pads, each extended I/O pad extending at least to and coming in direct contact with at least one peripheral side edge of the associated die, wherein each of the extended I/O pads on the active surface of the die forms an external contact pad arranged to electrically connect with an external device positioned over the active surface of the die and wherein an extended I/O pad on one of the dice extends to and comes in direct contact with at least two opposing peripheral side edges of the one of the dice.

\* \* \* \* \*